United States Patent
Chappo et al.

(10) Patent No.: US 6,510,195 B1
(45) Date of Patent: Jan. 21, 2003

(54) SOLID STATE X-RADIATION DETECTOR MODULES AND MOSAICS THEREOF, AND AN IMAGING METHOD AND APPARATUS EMPLOYING THE SAME

(75) Inventors: Marc A. Chappo, Elyria, OH (US); Randall P. Luhta, Highland Heights, OH (US); Rodney A. Mattson, Mentor, OH (US); Pieter G. Roos, Chagrin Falls, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 14 days.

(21) Appl. No.: 09/908,347

(22) Filed: Jul. 18, 2001

(51) Int. Cl.$^7$ ................................................ A61B 6/00
(52) U.S. Cl. .............................. 378/19; 378/4; 257/88; 250/208.1; 250/370.09
(58) Field of Search ........................ 378/19, 4; 257/88, 257/79, 80; 250/208.1, 370.09

(56) References Cited

U.S. PATENT DOCUMENTS

| | | | |
|---|---|---|---|
| 4,638,165 A | * 1/1987 | Glasow et al. | 250/370.09 |
| 5,477,075 A | 12/1995 | Forrest et al. | 257/432 |
| 5,592,523 A | 1/1997 | Tuy et al. | 378/19 |
| 5,801,430 A | 9/1998 | Forrest et al. | 257/434 |
| 6,025,585 A | * 2/2000 | Holland | 250/208.1 |
| 2002/0011639 A1 | * 1/2002 | Carlson et al. | 257/443 |

OTHER PUBLICATIONS

Holland et al., "Development of Low Noise, Back–Side Illuminated Silicon Photodiode Arrays," IEEE Trans. Nucl. Sci. 44(3), 443–447 (Jun. 1997).
Blackwell (Ed.), The Electronic Packaging Handbook, pp. 4–2 to 4–5 and 7–16 to 7–18 (2000).

* cited by examiner

Primary Examiner—Drew A. Dunn
Assistant Examiner—Pamela R. Hobden
(74) Attorney, Agent, or Firm—Fay, Sharpe, Fagan, Minnich & McKee, LLP

(57) ABSTRACT

A CT scanner (10) includes a reconstruction processor (32) and a mosaic X-Radiation detector (20). The mosaic detector includes plural detector elements (22, 22, 23, 24, 25, 26) arranged in abutting relationship and configured for the desired imaging application. The detector elements include scintillating crystals (50) in optical communication with a back-illuminated photodiode array (52) or modified top-surface photodiode array (152, 252) for converting emitted light into electrical charge. The photodiode array is mounted on a carrier substrate (58) via bump (56) bonding. The carrier substrate provides a conductive path routing the photodiode array output through to contacts on the back side for connection to readout electronics (60). The carrier substrate and readout electronics are contained within the footprint defined by the photodiode array, allowing the detector elements to be abutted on any and all sides, thus permitting the mosaic detector to be tailored to any desired size and shape.

36 Claims, 13 Drawing Sheets

SOLID STATE X-RADIATION DETECTOR MODULES AND MOSAICS THEREOF, AND AN IMAGING METHOD AND APPARATUS EMPLOYING THE SAME

BACKGROUND OF THE INVENTION

The present application relates to the art of medical diagnostic imaging in which penetrating X-Radiation is received by an X-Radiation-sensitive detector. The application subject matter finds particular use in computerized tomographic (CT) scanners and will be described with particular reference thereto. However, the invention may also find use in connection with other diagnostic imaging modalities, industrial quality assurance imaging, baggage inspection, X-Ray fluoroscopy, and the like.

Modern X-Ray computer tomography scanners commonly employ X-Radiation detectors to convert X-Ray energy into electrical signals. A detector is usually composed of a scintillator to convert X-Ray energy into light and photosensors, such as a photodiode array, charged-coupled device (CCD) array, etc., to convert that light into an electrical current. The formats of photodiodes used in CT applications include single photodiode elements, one-dimensional (1-D) integrated circuit (IC) photodiode arrays, and two-dimensional (2-D) IC photodiode arrays.

Typically, the electrical signal from each active photodiode element is individually routed to an adjacent pre-amplifier channel. A wire bond connects a top surface bond pad on one end of the photodiode to an external connection. The conductive path to downstream processing electronics is completed using various design options. Pre-amplifiers are either located on the same PC board that includes the detector array or at a more distant location accessed by a cable.

The bond pads are typically located at one end of the photodiodes in sparse 1-D arrays. As the density of elements in the array increases, the bond pads are located on either end of the 1-D array. In some embodiments, the wire bonds in adjacent channels are made at alternate ends.

The wire bond density becomes even more acute for 2-D arrays. A conductive trace from each inner photodiode element in a 2-D array to a connection point for electrical connection with an external connector must be provided. This trace is usually included on the photodiode surface between rows of active photodiode elements. One trace is required per element and each trace usually terminates in a bond pad at an end of the 2-D array. Wire bonds from each bond pad are then made to external connections.

As the number of elements in a 2-D array gets large, two restrictions occur. The space required to provide room for the conductive paths between the detector rows increases and the density of the bond pads at either end of each 2-D array also increases. There is a physical limit, in terms of cost, function, and reliability, as to the number and size of traces and bond pads that can be made using top surface contacts. A conductive path "bottleneck" occurs if there is not enough space on a surface to accommodate the number of traces from the photodiode bond pads to the detector electronics.

Also, it is difficult to build a mosaic detector of arbitrary size and shape, i.e., wherein a detector element can abut like detector elements on all sides. Since the contacts for external connections are made laterally, on the sides of the active area, a loss of active area on the receiving surface of the detector results.

Another problem relates to degradation of the signals as they travel over the long bus system between the X-Radiation detectors and the signal processing circuitry.

CT scanners operate in a sea of extraneous radio frequency electromagnetic signals, the frequencies of which vary over a wide band. Sources of extraneous signals include nearby operating electrical components, including high-power tube generators, equipment, signals from other detectors, and the like. The long bus systems include long lead wires which inadvertently act as antennas in picking up extraneous electromagnetic signals and converting them into analog signals. The extraneous analog signals are superimposed on and mix with the analog signals from the detectors. The superimposed extraneous signals appear as noise and fictitious data when reconstructed into images. The resulting images are degraded by noise, ghosting, and other artifacts.

The present invention contemplates an improved X-Radiation detector and CT method and apparatus which overcomes the above-referenced problems and others.

SUMMARY OF THE INVENTION

In one aspect of the present invention, a computerized tomography imaging scanner includes an X-Radiation-sensitive detector array for converting received X-Radiation into electrical signals and an image reconstruction processor for reconstructing images based on the received X-Radiation. The detector array includes a scintillation layer converting X-Radiation into visible light and a plurality of back contact photodiode detector modules optically coupled to the scintillation layer, and the detector modules tiled to form a mosaic detector. Each detector module comprises a bounded plane light-sensing surface defining a footprint and an electrical connector for connecting the bounded plane light-sensing surface to readout electronics, each electrical connector being contained within its respective footprint.

In a further aspect, the present invention relates to an imaging system comprising an X-Radiation source selectively generating X-Radiation which at least partially traverses an examination region. The imaging system also comprises an X-Radiation-sensitive layer which converts received X-Radiation into photons of light. Additionally, each X-Radiation detector module includes an array of photodetector devices, each device having a side in optical communication with the X-Radiation-sensitive layer and each generating electrical signals responsive to the photons of light generated by the X-Radiation-sensitive layer. Each detector module includes a carrier substrate supporting each photodetector device, the carrier substrate configured to provide an electrical path from contacts on a back side of the photodetector device through the carrier substrate.

In a further aspect of the present invention, an X-Radiation detector comprises an X-Radiation-sensitive surface which converts received X-Radiation into photons of light, a photosensitive device which has a side in optical communication with the X-Radiation-sensitive surface and which generates electrical signals responsive to the photons of light generated by the X-Radiation-sensitive surface, and a carrier substrate supporting the photosensitive device, the carrier substrate configured to provide an electrical path from contacts on a back side of the photosensitive device through the carrier substrate.

In yet a further aspect, the present invention relates to an imaging method comprising irradiating an X-Radiation-sensitive surface with X-Radiation, converting the X-Radiation incident upon the X-Radiation-sensitive surface into light, transmitting the light to a light-sensitive surface of a photodiode array to produce an electrical signal proportional to the converted light, and communicating the electrical signal to signal processing circuitry via a conductive path. The conductive path comprises a first set of contacts disposed on a back surface of the photodiode array opposite the light-sensitive surface; a second set of contacts disposed on a front surface of a circuit carrying substrate, the second set of contacts aligned with and electrically coupled to the first set of contacts when the back surface of the photodiode array and the front surface of the substrate are in aligned facing relation; and a third set of contacts disposed on a back surface of the substrate opposite the front surface of the substrate.

In another aspect, a front-illuminated photodiode array is provided, in which signals from the photodiode elements are passed to the photodiodes backside using conductive vias. The vias are made conductive by impurity diffusion of the substrate silicon. On the backside, a metal pad forms an ohmic contact to the diffused region of the via. Bump bonds are then made to these backside contacts. The impurity diffused via forms a reverse bias diode contact with respect to the subsrate silicon and thus an independent conductor for the photodiode signal from the topside.

One advantage of the present invention resides in locating the electrical conductors from the photodiode beneath the photodiode array.

Another advantage in one embodiment of the invention resides in freeing the light-sensitive surface from electrical conductors.

Another advantage of the present invention resides in the ability to disperse a plurality of electrical leads or traces through a multi-level substrate.

Another advantage in one embodiment of the invention is that the present invention increases the active surface area of the photodiodes available to receive X-Rays.

Another advantage is that it improves X-Ray conversion efficiency.

Another advantage of the present invention resides in the ability to group a plurality of detector arrays together into a variety of configurations.

Yet another advantage of the present invention is that signal processing electronics can readily be shielded from X-Radiation.

Another advantage resides in the ability to reduce the number of contacts by incorporating multiplexing circuitry as a part of the functional integrated circuitry of the photodiode array.

Still further advantages will become apparent to those of ordinary skill in the art upon reading and understanding the following detailed description.

BRIEF DESCRIPTION OF THE DRAWINGS

The invention may take form in various components and arrangements of components and in various steps and arrangements of steps. The accompanying drawings are provided only for purposes of illustrating preferred embodiments and are not to be construed as limiting the invention.

DETAILED DESCRIPTION OF THE PREFERRED EMBODIMENT

Figure 1:
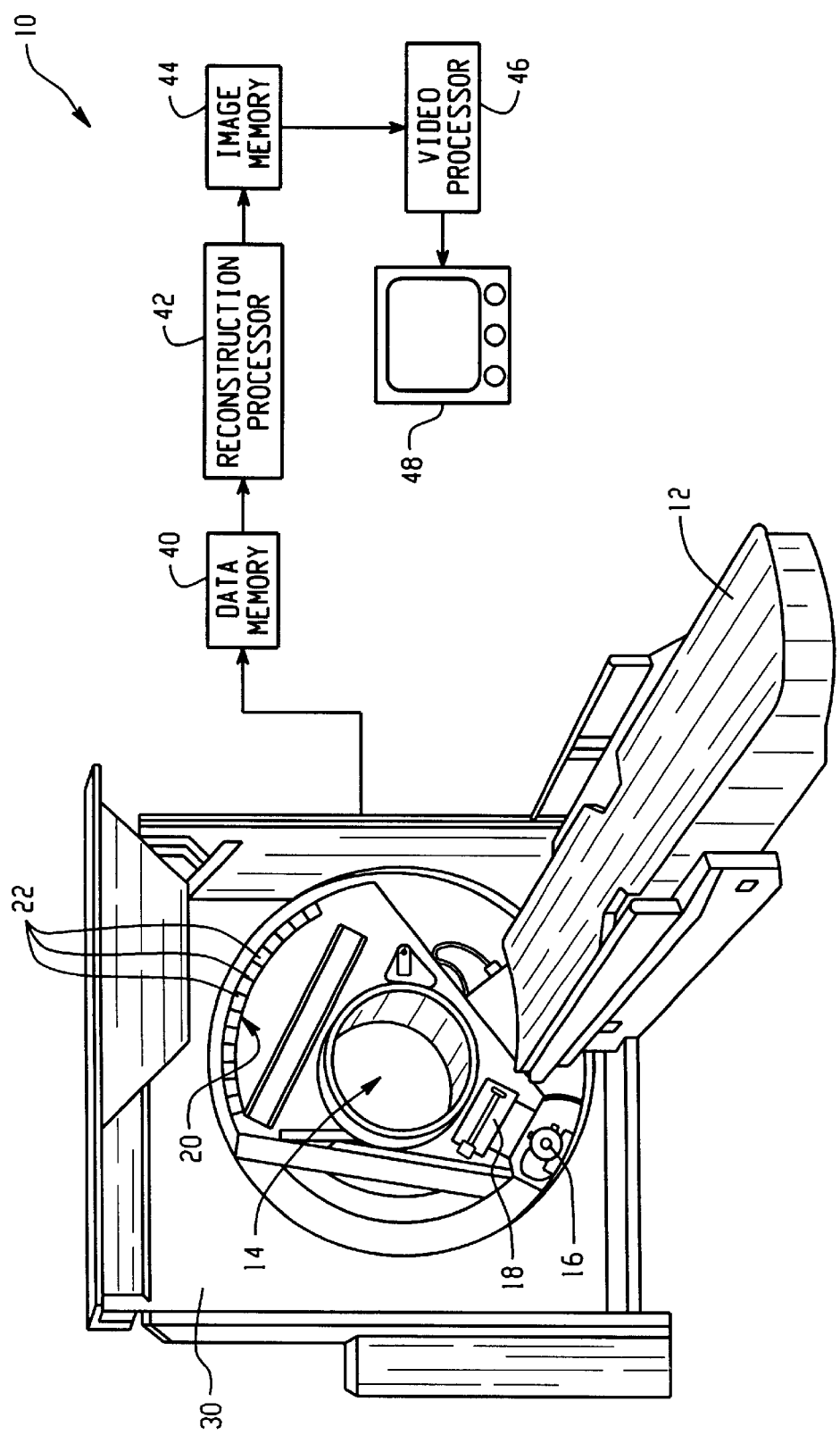
FIG. 1 illustrates a CT scanner employing a two-dimensional detector array in accordance with the present invention.

With reference to FIG. 1, a CT scanner 10 selectively images regions of a patient supported by a patient table 12 in a scan circle or examination region 14. The patient table is positionable longitudinally. The CT scanner has an X-Ray tube 16 which emits a beam of X-Rays toward an area of the patient being examined. In the preferred embodiment, a collimator 18 collimates the X-Rays into a cone beam. When the examination area is irradiated with the X-Ray energy, a percentage of the X-Rays reaching the examination area is absorbed by the patient's body. The amount of absorption depends on the density of bone or tissue upon which the X-Rays are incident. The fluence of the X-Rays exiting the patient's body is indicative of relative tissue and skeletal densities.

With continued reference to FIG. 1, a mosaic detector array 20 in accordance with this teaching receives X-Radiation, which has traversed the examination area 14. In the illustrated embodiment, the detector array 20 is mounted to a rotatable portion of a gantry 30 so that the array 20 and the X-Ray source 16 rotate in a fixed relative position. Preferably, the individual detector elements or segments comprising the mosaic array 20 are arranged to receive a cross-sectioned cone of X-Radiation. Alternately, the array segments can be arranged to match a conical-shaped cross-section of X-Radiation or other configuration to provide coverage of a desired region of the subject to be imaged. Each array segment is disposed along a plane normal to the center line of the cone shaped X-Ray beam. Cone shaped beams allow a larger volumetric region of the patient to be imaged per unit of time when compared with a patient region imaged using conventional fan-shaped beams.

The photodetector array 20 and its associated data acquisition electronics are in electrical communication with a data memory 40 for receiving signals indicative of the received X-Radiation. The memory 40 is accessible by a reconstruction processor 42 which converts scintillation events into a diagnostic image representation using reconstruction algorithms. The image representation is stored in an image memory 44 and is selectively accessible and displayable by a video processor 46 for output to a human-viewable display 48.

For ease of exposition in further describing many of the following drawing figures, some necessary details are omitted, such as analog common or ground connections required for proper operation. However, such details are readily apparent to those skilled in the art.

Figure 2A:
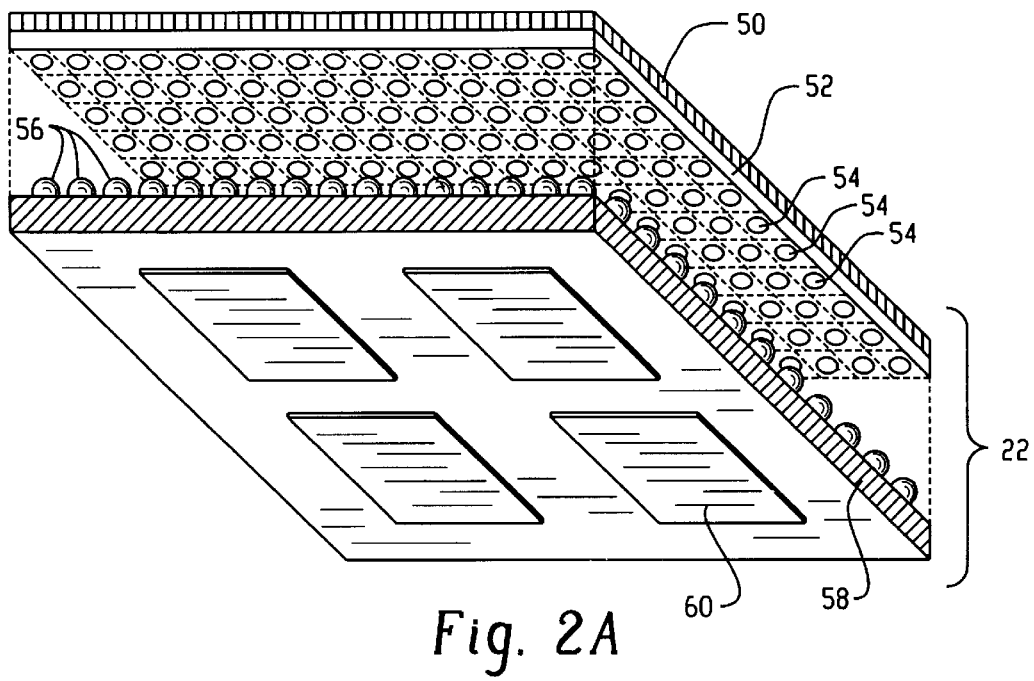
FIG. 2A illustrates a photodetector array as employed in the present invention.

With reference to FIG. 2, an X-Radiation detector element 22 in accordance with a first embodiment of the present invention includes a scintillating layer 50 overlaying, and in optical communication with, a light receiving surface of a back-illuminated photodiode (BIP) array 52. The scintillator layer 50 is a material which emits light, e.g., visible light, when incident X-Radiation is received by the scintillating layer. Exemplary scintillating materials include cadmium tungstate, GOS, or other similar material capable of generating visible light with a spectral match to the photodetectors upon being excited with X-Radiation.

X-Radiation that has traversed the examination area 14 (FIG. 1) is received by the scintillation layer 50. The scintillation layer converts the X-Radiation into photons of light which enter the light receiving surface of the BIP array 52. The scintillation layer is covered on surfaces, except the surface which is optically coupled to the photodetector, with an X-Ray transmissive, optical light reflective coating. Preferably, the coating is reflective such that substantially all generated light is reflected to the photodetector array. Spatial intensity patterns of light emitted from the scintillation crystal array are proportional to spatial patterns of the X-Radiation having traversed the examination area 14.

The scintillator 50 can be attached to the BIP array 52 by a number of methods. For example, the scintillator 50 can be coated, deposited, or integrally formed onto the input surface of the BIP array 52, or, can be a separately formed sheet of scintillating material that is held into place on the input surface by other means, such as an optically transmissive adhesive (e.g., optical coupling cement), or the like. The scintillator 50 and BIP array 52 can be of the same size or "footprint," such that when a mosaic detector is fabricated from multiple detector elements 22, each BIP array 52 will have a corresponding, coextensive scintillating layer. Alternately, and more preferably, a single scintillating layer 50 is placed globally over an entire detector formed from a tiled mosaic of multiple detector elements to increase uniformity and reduce the likelihood of producing artifacts at the module boundaries. This embodiment is primarily suited to fluoroscopic imaging. The scintillation layer 50 is covered with a light reflective surface and a light opaque, X-Ray transmissive covering to prevent extraneous light from reaching the photodiodes.

The BIP array 52 is a single, monolithic, semiconductor substrate having functional integrated circuitry formed thereon. The functional integrated circuitry includes a matrix of photosensitive elements or "pixels," preferably photodiodes, formed on the light receiving side. The integrated circuitry of the BIP array 52 is generally manufactured from silicon or other semiconductor wafers using established integrated circuit fabrication processes, such as masking, evaporation, etching, and diffusion processes, and so forth. The photosensitive elements are electrically coupled to a set of contact or bond pads 54 disposed on the back side of the BIP array 52 by electrical connections routed through the semiconductor substrate. The light received by the photodiodes is converted into a corresponding charge value which is carried from the active area of the BIP array to the carrier substrate 58 via the electrical leads or connectors 54 on the backside of the BIP array device 52 as an output current that is proportional to the number of light photons received.

Each detector module 22 is thus a small matrix image detector arranged in an n×m array of detector elements or pixels. By way of nonlimiting example that is suitable for CT imaging, each module 22 can advantageously range in size from about 12 mm×12 mm to about 75 mm×75 mm. By way of example, the number of pixels can range from ½ to 2 per mm. In a preferred embodiment for CT imaging, each module is 25 mm×25 mm, and has 256 pixels arranged in a 16×16 matrix. By way of a second nonlimiting example that is suitable for X-Radiation fluoroscopic imaging, each module 22 can advantageously range in size from about 12 mm×12 mm to about 75 mm×75 mm. By way of example, the number of pixels can range from 1 to 3 per mm. In a preferred embodiment for X-Radiation fluoroscopic imaging, each module is 25 mm×25 mm and has about 4096 pixels arranged in a 64×64 matrix. It will be recognized that the modules may be shapes other than square, such as rectangular, hexagonal, triangular, etc. It will also be recognized that the size, pixel matrix density, and shape of each module can be selected in accordance with the intended imaging application, desired resolution, and so forth, and can vary widely without departing from the scope and inventive concept of the present invention.

BIP array 52 is attached to a carrier substrate 58 using a bump bonding technique. Carrier substrate 58 carries an electrical circuit configured to facilitate an electrical connection between the BIP array and downstream data acquisition and signal processing electronics. In bump bonding, conductive balls or bumps 56, e.g., made from a metal, metal alloy, or other conductive material, such as a conductive adhesive or conductive epoxy, provide an electrical connection between the contact pads 54 of the BIP array and corresponding aligned contact pads 55 (see FIG. 6) on the front surface of the carrier substrate 58. Such systems provide both the mechanical bonding and electrical connections between the chip 52 and the carrier substrate 58. The bumps 56 are a soft metal, such as gold, copper, aluminum, lead-tin solder, and so forth, or a conductive adhesive, such as a conductive epoxy, or the like. Any space between the BIP array and the carrier substrate can optionally be filled with an underfill material to encapsulate the connections and provide additional mechanical benefits.

A number of such methods for attaching IC chips are generally known in the art and may be employed in connection with the present invention. A number of such bump bonding techniques are known, some of which are known variously as flip-chip bonding, "controlled collapse chip connect" or "C4" techniques, ball grid array techniques, and so forth. The metal bumps can be first formed or built on the face of the IC chip and then connected to aligned contact pads of the carrier substrate by aligning the chip and substrate and pressing together with well-controlled heat and pressure. Alternatively, the solid metal balls can be placed on and/or connected (e.g., by a reflow operation) to the carrier substrate contact pads, again followed by aligning the chip and substrate and pressing them together under well-controlled heat and pressure. Conductive adhesives balls are advantageous in that they eliminate the need for reflowing and the relatively high degree of heating that traditional metal balls require to form the interconnection.

The carrier substrate 58 carries an electrical circuit to route the output signals from the BIP array to downstream data acquisition and signal processing or readout electronics 60. In one embodiment, radiation hardened electronics are used. In an alternate embodiment, the electronics 60 are shielded to allow the use of non-radiation hardened electronics. The carrier substrate 58 can be a printed circuit substrate carrying metal tracings, e.g., a printed circuit relief pattern. The substrate can be a rigid or semi-rigid material, such as fiberglass reinforced epoxy and the like, or a flexible film formed from a dielectric material, typically a polymeric film such as a polyimide, polyester, or other material known for the manufacture of flexible film substrates. Alternately, the carrier substrate 58 can be a ceramic modular packaging, lead frame, or other carrier substrate.

Through-holes or vias 70 (see FIG. 6), such as micro-vias, are used to route the signal to a set of contact pads 57 (see FIG. 6) disposed on the back side of carrier substrate 58. Data acquisition and signal processing electronics 60 are located on the back side of carrier substrate 58 and electrically coupled to contacts 57. In the embodiment of FIG. 2, each photodiode of the photodiode array 52 has an individual contact on the BIP backside to be routed through carrier substrate 58 and passed on to multiplexing and amplification circuits 60, and optionally, signal-conversion circuits. Thus, in the preferred embodiment of a 16×16 pixel matrix for CT imaging, or a 64×64 pixel matrix for X-Radiation fluoroscopic imaging, both in a 25 mm×25 mm area, the number and density of the connections will generally require the use of a substrate 58 having multiple layers of internal tracings 72 (see FIG. 6) and vias 70.

Figure 2B:
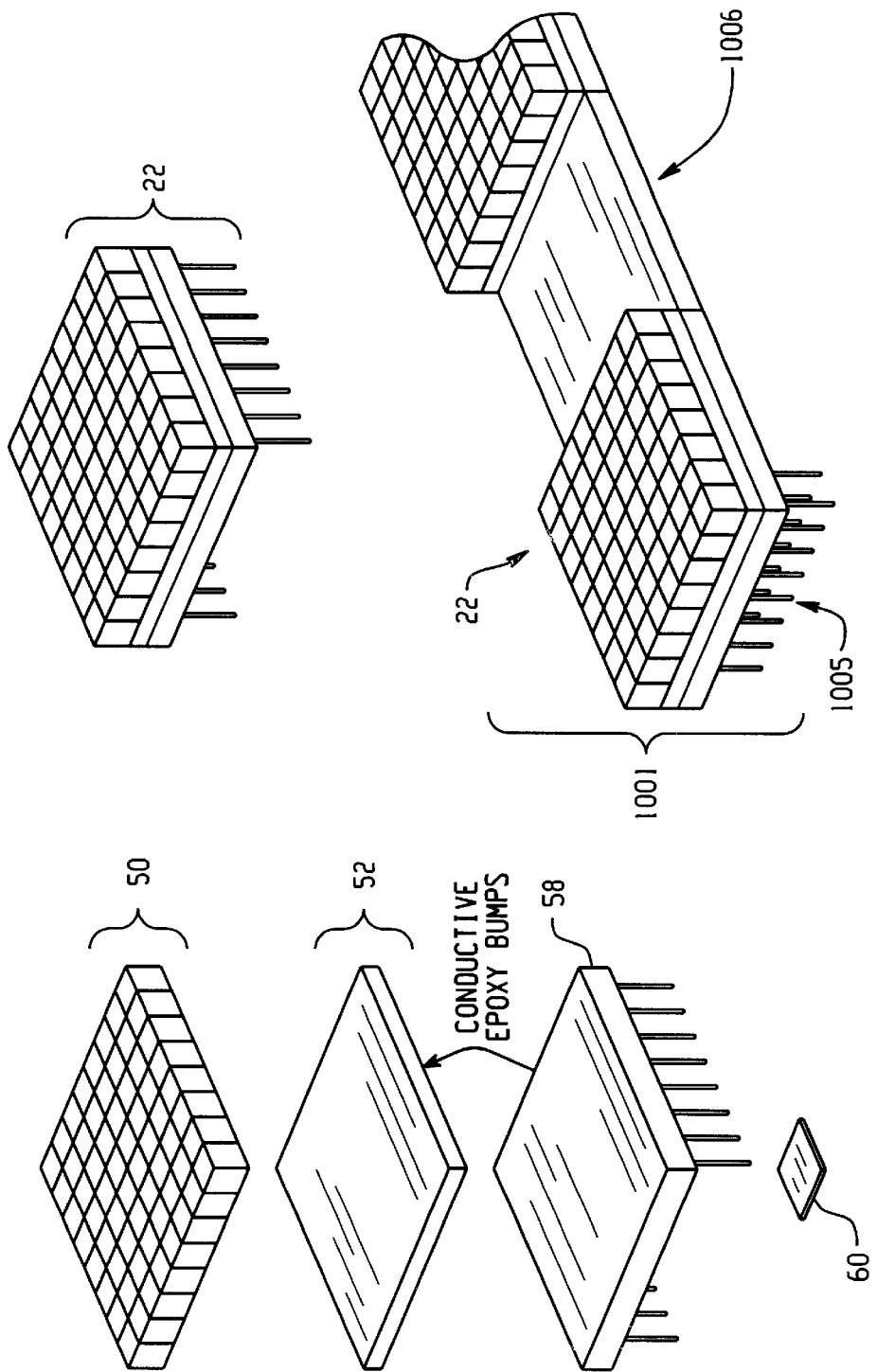
FIG. 2B illustrates an embodiment of an X-Radiation detector array tiled in one dimension to form a CT detector module.
Figure 2C:
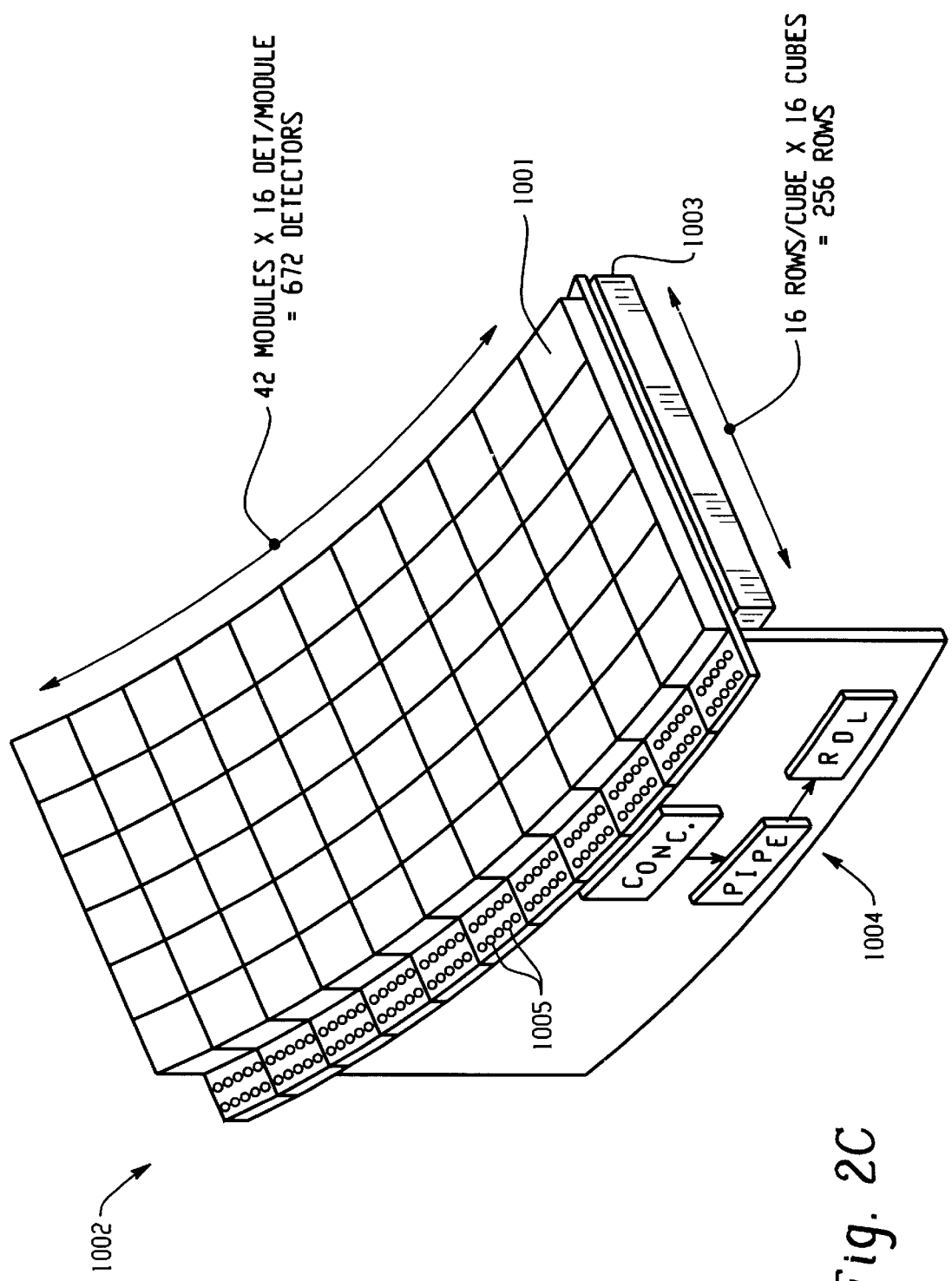
FIG. 2C illustrates multiple CT detector modules arranged in an arc to form a complete CT imaging system.

Referring now to FIGS. 2B and 2C, plural modules 22 of FIG. 2 are used to form a CT detector module 1001. Plural modules 1001 are, in turn, used to form a complete CT imaging system 1002. The detector module 1001 contains a substrate 1006 to which submodules 22 are mounted in a line.

The substrate 1006 contains conductors to distribute electrical signals. The substrate 1006 also has a connector 1005 interface to peripheral electronics. The substrate 1006 may or may not contain active electronic components other than the submodules 22.

A number of detector modules 1001 can be arranged to form yet a larger array 1002. For CT imaging, the modules 1001 can be arranged in an arc to form a complete CT imaging system 1002. The modules 1001 are mechanically supported by an underlying structure 1003. Electrical signals from the module 1001 are routed to a common electrical board 1004 via connectors 1005. The common electrical board 1004 contains electronics to process signals from the modules 1001 and pass these processed signals to the CT reconstruction system.

By way of nonlimiting example that that is suited for CT imaging, the submodules 22 have a 16×16 pixel array with a 25 mm×25 mm dimension. The detector modules 1001 each contain 16 submodules 22. The detector module thus becomes an X-Radiation detector array of 16×256 pixels with a 25 mm×400 mm dimension. By arranging 42 of the detector modules 1001 into an arc, a complete CT imaging system is formed. The complete system 1002 is a 672×256 pixel element array of X-Radiation detectors. Signals from the detector modules 1001 are routed through connectors 1005 to a common electronics board 1004 which processes the digital data before passing it to the CT reconstruction system. An aluminum or steel metal structure 1003 provides mechanical support for the detector modules 1001 and common electronics board 1004.

Figure 3:
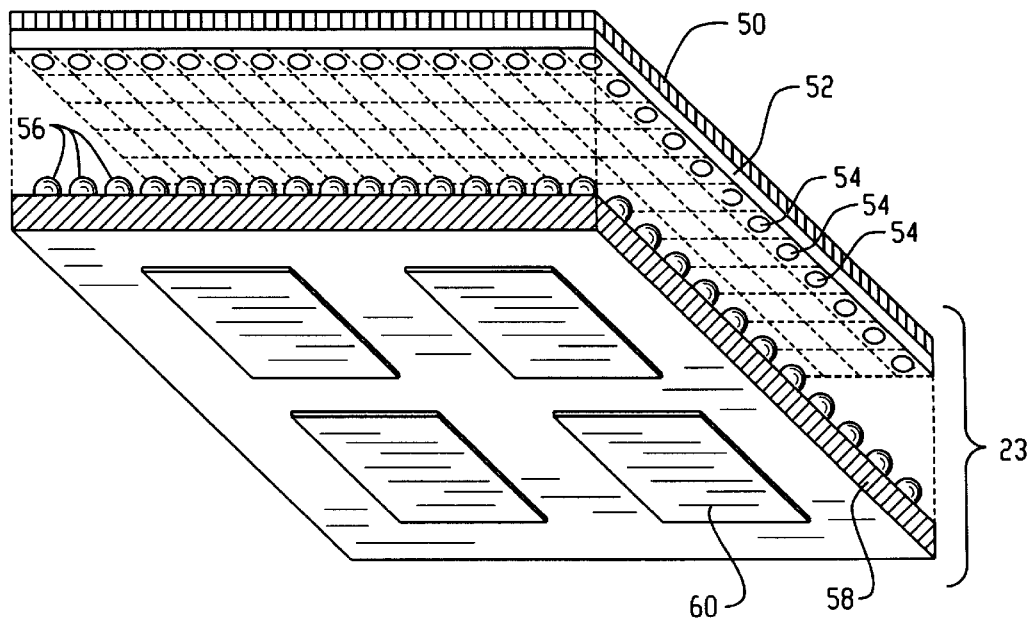
FIGS. 3 and 4 illustrate two embodiments of the present invention wherein multiplexing circuitry is incorporated as a part of the functional integrated circuitry of the photodiode array.
Figure 4:
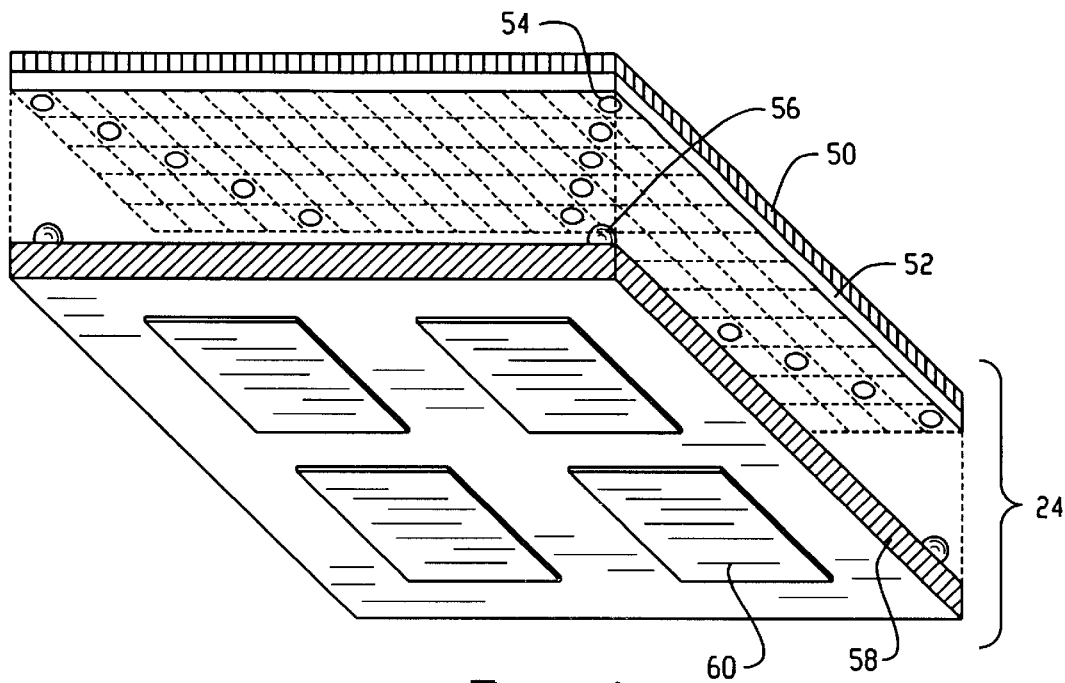

Referring now to FIGS. 3 and 4, there are shown two embodiments of an X-Radiation detector module 23 and 24, respectively, similar to the module 22 shown in and described in reference to FIG. 2, but wherein multiplexing electronics are incorporated as a part of the functional integrated circuitry in the BIP array 52. This implementation of multiplexing is primarily suited to fluoroscopic imaging. By sequentially scanning rows and columns, the number and density of interconnections between BIP array 52 and carrier substrate 58 and between carrier substrate 58 and the readout electronics 60 is greatly reduced. In the 64×64 pixel matrix embodiment, the number of interconnections is reduced from about 4096 to about 130.

Because of the reduced number of contacts, the carrier substrate is a relatively simple interconnect component, for example, not requiring a multiple layer circuit board. In the embodiment of FIG. 3, the interconnections are made along two adjacent edges. In the embodiment of FIG. 4, the multiplexed output contacts are arranged in a generally X-shaped pattern. Other arrangements are contemplated as well.

Figure 5:
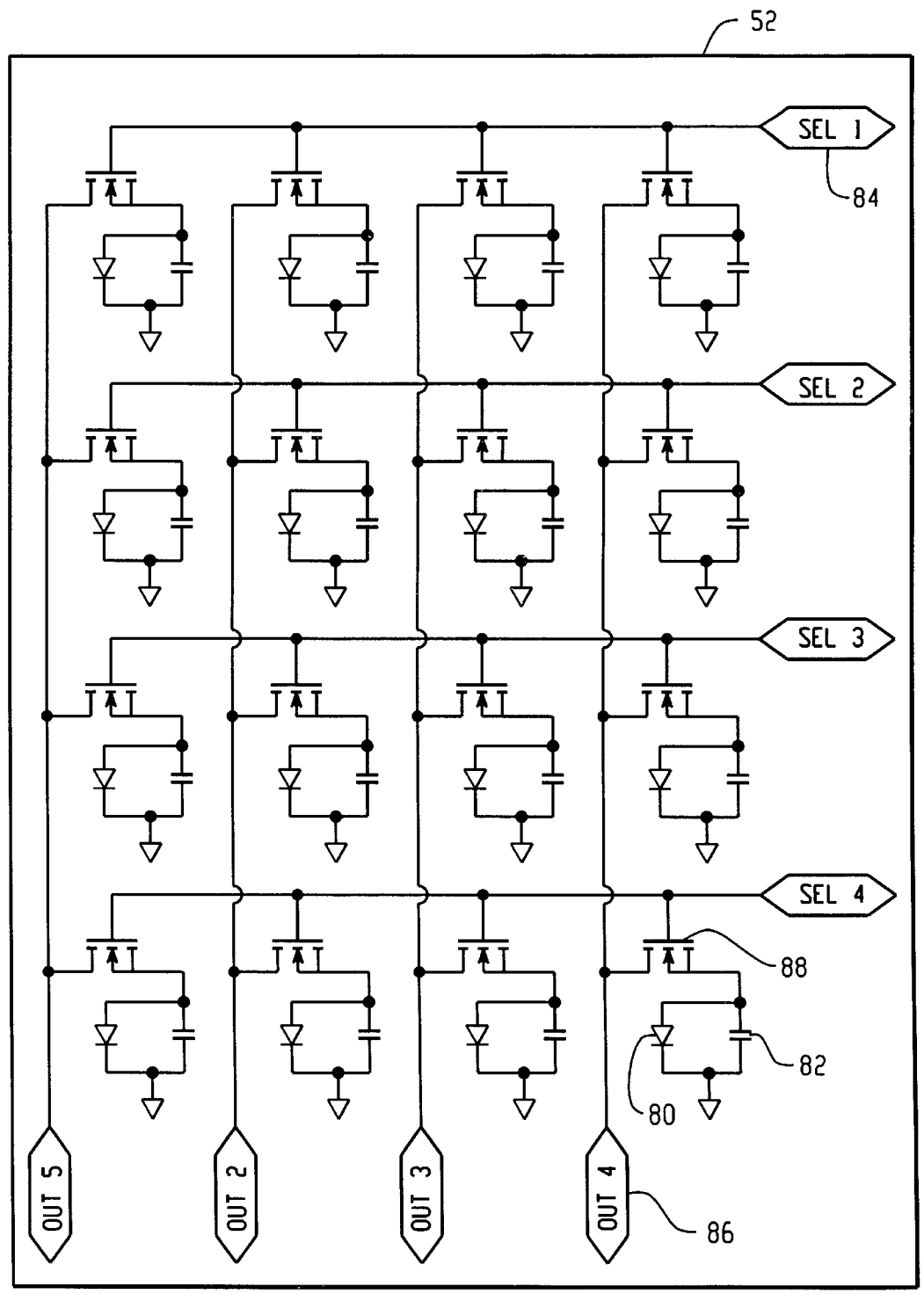
FIG. 5 is a schematic drawing of multiplexing circuitry implemented in integrated circuitry of the photodiode array.

Referring now to FIG. 5, there is shown a schematic circuit diagram illustrating an exemplary implementation of electronic multiplexing as a part of the functional integrated circuitry of the BIP array 52. Multiplexing is advantageous in that it reduces the cost and complexity of the carrier substrate 58. Also, the reduced complexity of the signal routing reduces the likelihood of corruption of the very low signal levels produced by the BIP array. In the illustrated embodiment, the multiplexing is in the form of a matrix connection of analog switching devices located at each pixel. A charge is generated in the individual photodiode elements 80 in proportion to incident light. This charge is accumulated in the inherent photodiode junction capacitance 82. At the end of an accumulation period, e.g., having a duration of one video frame, all of the switches 88 for one matrix row are turned on through the relevant selection line 84. Each switch 88 may be a transistor, switching transistor (typically a MOSFET device), or an arrangement of diodes. The total accumulated charge from each pixel in the selected row is then dumped to the input of an individual amplifier contained in downstream electronics 60, via an individual matrix column line 86. The selection lines 84 are turned on in sequence until all of the pixels of a detector module have been read. Alternately, a fixed reverse voltage can be placed on each pixel capacitance 82 at the start of each integration period. This voltage will then be depleted by current from the input signal. The amount of charge needed to restore the voltage prior to the next frame is equal to the amount of signal charge generated during the integration period. In still further embodiments, a separate multiplexing subsystem can be formed as part of the functional integrated circuitry formed on the BIP array chip.

In some instances, however, it is desirable to provide each photodiode of the BIP array with its own contact on the BIP array backside. Since multiplexing circuitry is not used on the BIP array, the cost and complexity of the BIP array is reduced. Also, the performance characteristics of the BIP device can, in some cases, be improved, for example, in terms of dynamic range, signal-to-noise ratio, and data rate capability. FIGS. 6–10 illustrate some of the presently preferred embodiments for the accommodation of individual outputs from the BIP array.

Figure 6:
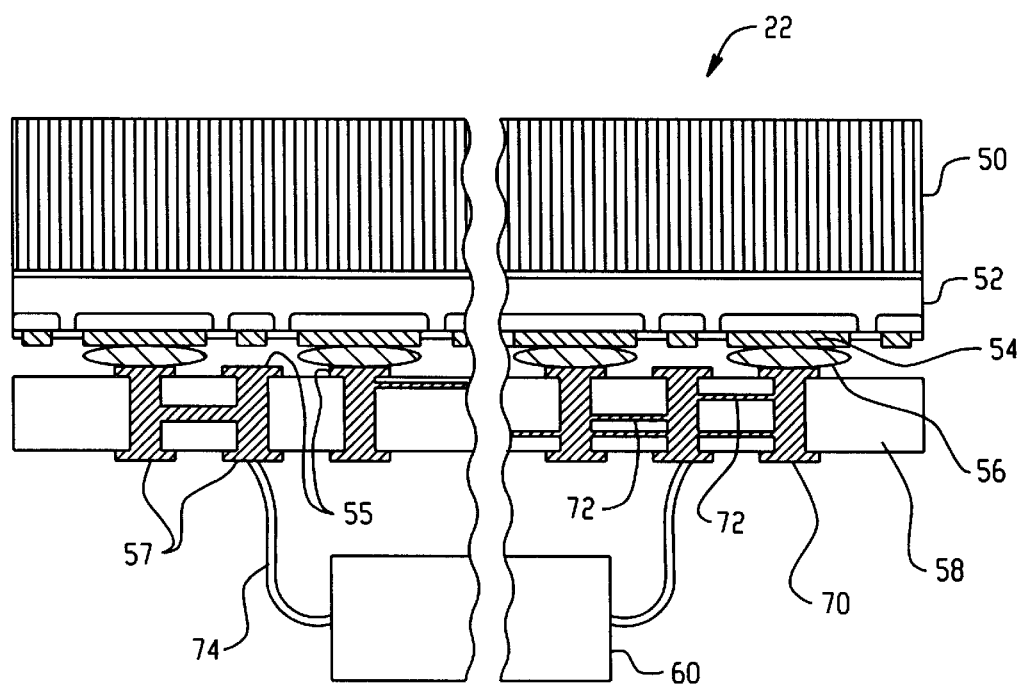
FIG. 6 is a cross-sectional view of an X-Radiation detector element of the present invention.

Referring now to FIG. 6, there is shown cross-sectional view of an X-Radiation detector element 22 of the present invention employing a BIP array 52 having a set of individual contacts 54 on its back surface for each photodiode element of the array. Again, scintillating layer 50 is optically coupled to the front, light receiving surface of BIP array 52. The back surface of BIP array 52 is bump 56 bonded to a carrier substrate 58. Vias 70 in the carrier substrate, in turn, electrically interconnect a set of top surface contacts 55 with a plurality of internal conductive layers 72, in different layers in the multi-layer carrier substrate 58. By "conductive layer" is meant a layer of conductive material which is typically arranged into a circuit pattern. The conductive traces 72 in the multi-layer substrate are electrically connected with a set of contact pads 57 on the back surface of the carrier substrate 58. The contact pads 57 provide connection points for processing electronics 60, preferably using wire bonds 74.

Figure 8:
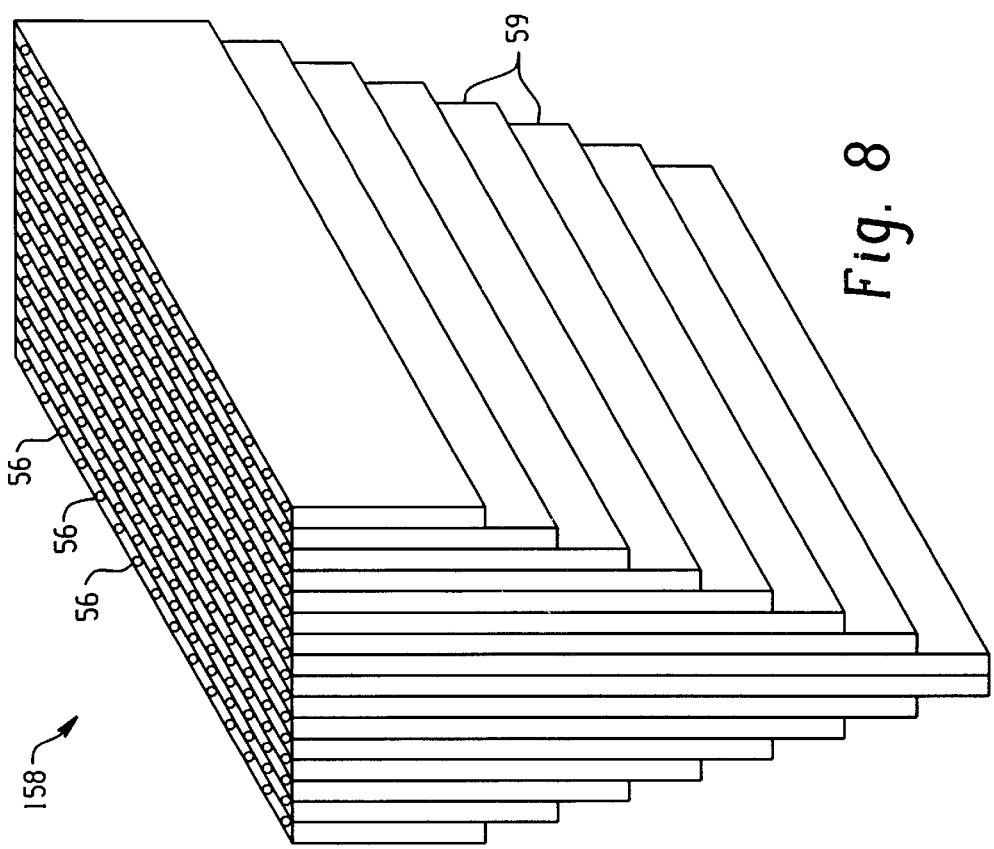
FIGS. 7 and 8 illustrate an embodiment using a dispersion block to provide detector elements having four-sided abutment capability.
Figure 7:
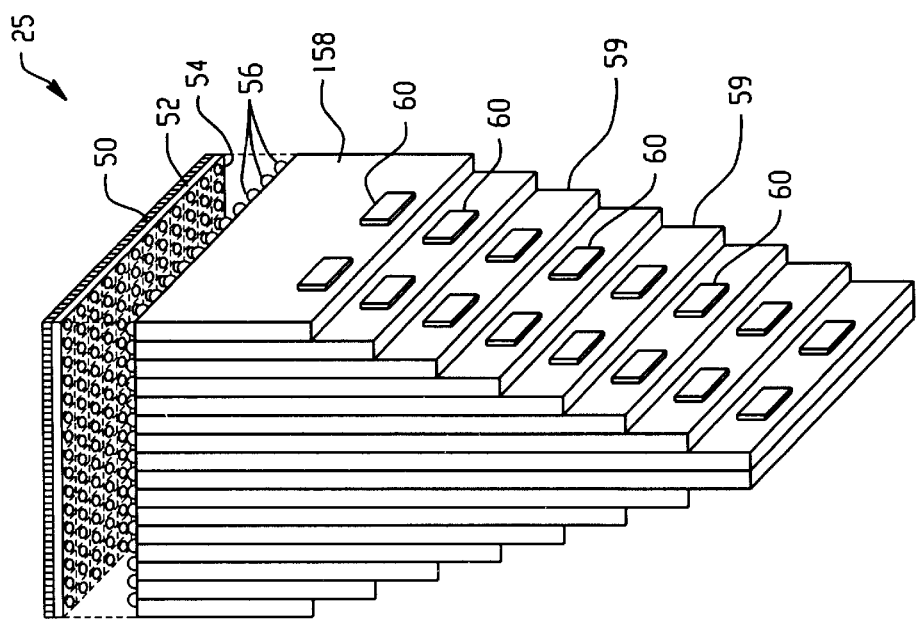

FIGS. 7 and 8 illustrate an embodiment of an X-Radiation detector element 25 employing a BIP array 52 having an individual contact 54 on its back surface for each photodiode element of the BIP array. Again, scintillating layer 50 is optically coupled to the front, light receiving surface of BIP array 52. The back surface of BIP array 52 is bump 56 bonded to a dispersion block 158. FIG. 8 shows the contacting surface of dispersion block 158 and the grid of conductive bumps or balls 56 thereon. The dispersion block 158 comprises multiple circuit boards 59 in a stacked arrangement that allows individual routing of each signal track from BIP array 52 to an individual input of multiplexing and amplification circuits 60, and, optionally, signal-conversion circuits. The circuit boards 59 are sized and arranged to form a geometrical configuration providing sufficient surface area to carry the electronics 60 while maintaining the ability to form a mosaic of multiple detectors in abutting relationship. The tiered or stepped geometric arrangement of circuit boards 59 to form dispersion block 158 is illustrated by way of example only. Other geometric arrangements of circuit boards to form a dispersion block are also contemplated. Likewise, implementations other than stacked arrangements of circuit boards are also contemplated, such as dispersion blocks fabricated from anisotropic conductor materials, the use of wire-skin devices in place of circuit boards, etc.

Figure 9:
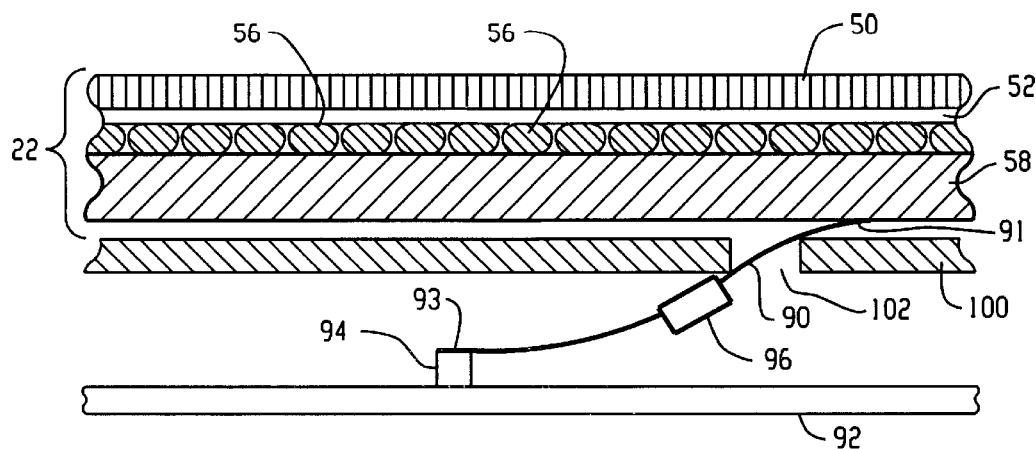
FIG. 9 illustrates an embodiment employing tape automated bonding and providing shielding of readout electronics.

FIG. 9 illustrates another method of routing a large number of interconnections to off-chip multiplexing circuits. The detector module 22 comprises scintillating layer 50 in optical communication with a light-sensitive surface of BIP array 52. Output signals from each photodiode of the BIP array are routed through the semiconductor substrate in which the BIP array is formed to a like number of contact pads 54 (see FIG. 2) disposed on the back side of BIP array 52. BIP array 52 is bump bonded to a carrier substrate 58, again, having aligned contact pads 55 (FIG. 6) on its upper surface and conductive traces 72 (FIG. 6), preferably multiple levels thereof, and vias 70 (see FIG. 6) for routing the BIP array output signals to contacts 57 (see FIG. 6) on the backside of the carrier substrate 58. One or more tape automated bonding (TAB) devices 90 are used to connect to the underside contacts 57 to a circuit board 92, such as a motherboard, daughterboard, or other central circuit board. The TAB device 90 comprises a dielectric film or tape carrying fine ranks of conductive traces. A first, input, end 91 has a high density of electrical conductors, typically having about 100 μm spacing, and is connected to substrate 58 using conventional TAB bonding techniques. A second, output, end 93 has a much lower density of tracks, typically about 500 μm spacing, and is connected to circuit board 92 using a connector 94 or, alternately, using direct solder connections. An amplification and multiplexing chip 96 is placed along the length of the tape to amplify and reduce the number of connections on the output end 93. In the illustrated embodiment, an optional shielding member 100 is disposed between the module 22 to protect downstream electronics, or other electronic devices disposed behind the detector, from X-Radiation. The shield 100 is preferably lead, tungsten, molybdenum, or the like, and has slots or openings formed therein for routing the TAB connections 90. Shield 100 can be omitted when X-Radiation hardened readout electronics are employed. In an alternative embodiment, the substrate 58 is omitted, with the TAB connector 90 being attached directly to the back contacts 54 of BIP array 52.

Figure 10:
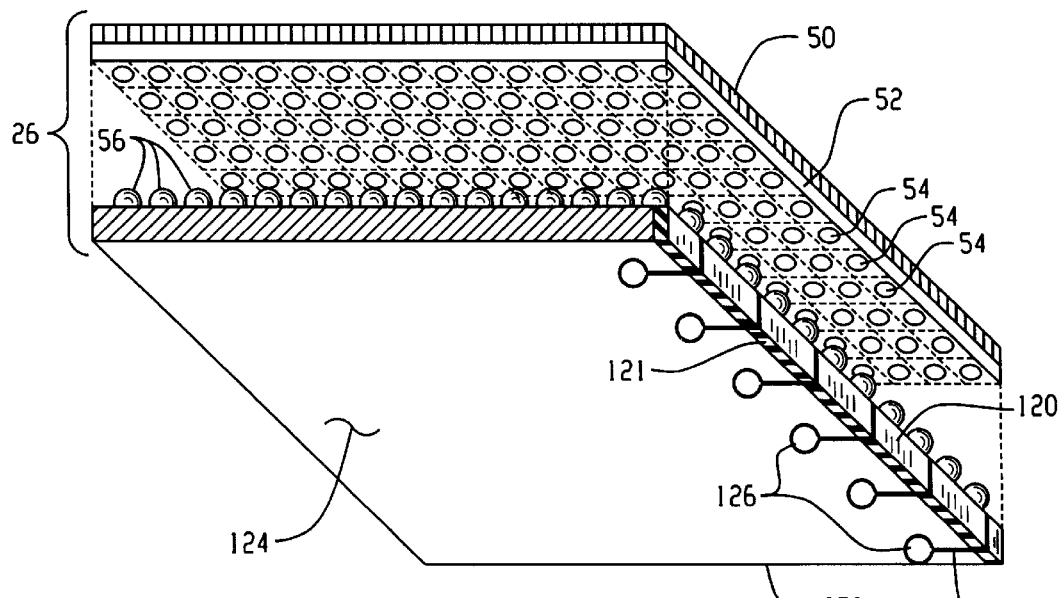
FIG. 10 illustrates an embodiment in which the photodetector array is directly bonded to an application specific integrated circuit (ASIC). Electrical connections from the bottom to the top of the ASIC are provided conductive structures on the side of the ASIC wafer.

FIG. 10 shows yet another embodiment of a detector module 26 having BIP array 52 with overlaying scintillation crystal 50. The BIP array is bump bonded via bumps 56 to a matching array of electronics on a readout application-specific integrated circuit (ASIC) 258, which is a one-to-one match in length and width, to the BIP Array 52. In a first embodiment, the readout ASIC 258 has individual A/D conversion electronics for each photodiode of the BIP array. In an alternative embodiment, ASIC 258 contains multiplexing circuitry to multiplex the photodiode signals to the A/D conversion electronics. ASIC 258 has electrical contacts brought to the back surface 124 thereof, thus allowing tiling of multiple modules 26 in two dimensions while providing convenient connection to external processing electronics. The front to back connections on readout ASIC 258 can be formed by a number of methods. For example, conductive metallizations formed around one or more peripheral side surfaces 120 to provide an electrical connection to contact points on the front surface. The metal can be built on the chips in a thin layer by a number of plating or deposition methods, such as thermal evaporation, sputtering, electroplating, or other technique. As the conductive material, there may be used, for example, gold, copper, silver, palladium, or other material having a high conductivity. According to a first embodiment, the metallization layer is built on the chip by selectively plating a thin layer of conductor. According to another embodiment, the metallization may be built on the chip by attaching a conductive ribbon which can be one of the above-listed metals or other conductive material. The present invention is not limited to the use of the aforementioned metals and additional metals may be employed as will be apparent to those skilled in the art. The metal layers 122 electrically couple the functional integrated circuitry of the readout ASIC 258 and contact pads or bond pads 126 formed on the back side 124 of the ASIC 258. An insulating layer 121 is required between the metal 122 and the silicon substrate. The insulating layer may be formed from, silicon monoxide, silicon dioxide, silicon nitride, metal oxide, such as aluminum oxide, titanium oxide, etc., polyimide, and the like, using conventional insulation, passivation, or deposition techniques. Alternately, or additionally, the metal layers can be placed in notches or recesses formed in a peripheral edge 120 so as to prevent electrical contact between the metal layers 122 and adjacent readout ASICs when tiled together to form a mosaic.

Figure 11A:
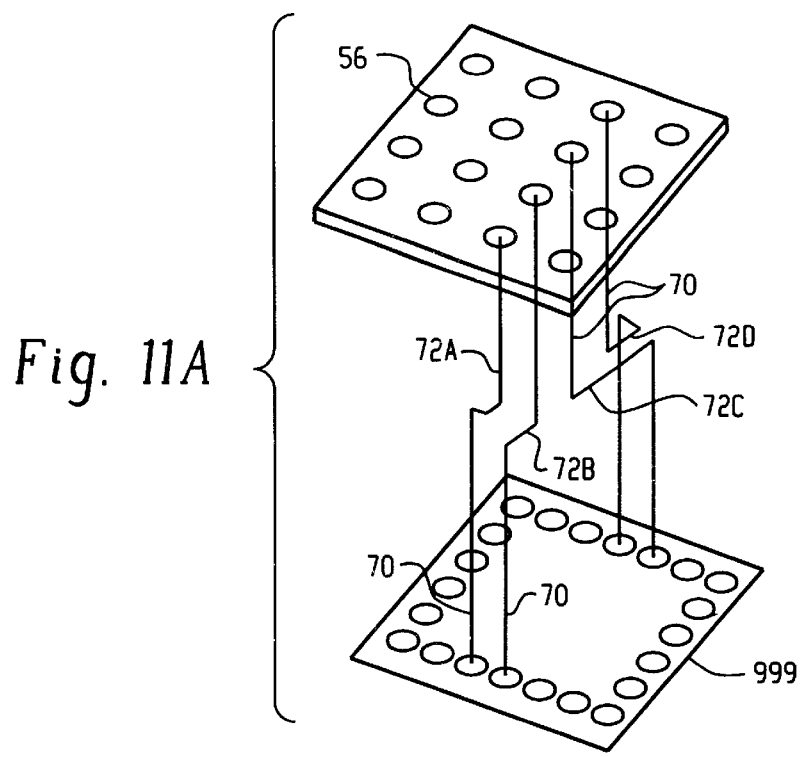
FIGS. 11A, 11B, and 11C are exploded top, top, and bottom perspective views, respectively, illustrating an embodiment employing wire bonding and providing X-Radiation shielding of Readout electronics.
Figure 11B:
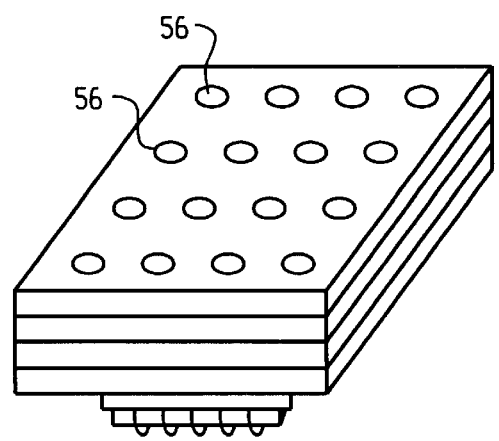
Figure 11C:
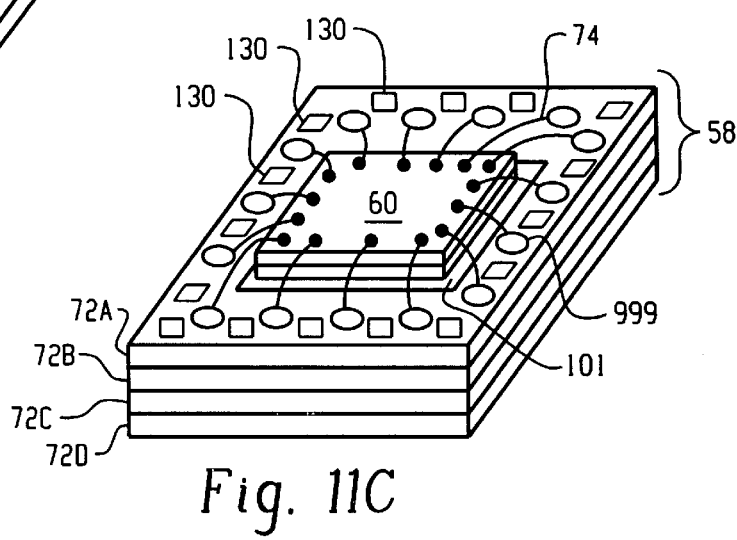

Referring now to FIG. 11, an embodiment employing an X-Radiation shielding member 101 and wire or wedge bonds 74 is depicted. A BIP array and scintillation layer (not shown) are carried on multilayer substrate 58, as described above. Connection pads 130 provide power supply and I/O connections to and from downstream electronics. Bump bonds 56 provide electrical coupling from the contacts of the BIP array to a matching set of contacts 56 on the upper surface of substrate 58. The vias and traces 70 in the substrate, in turn, electrically interconnect the top and bottom surfaces with traces on unique internal layers 72A–72D of the multi-layer substrate 58. Different numbers of layers may be employed in conjunction with different numbers of traces per layer. The conductive pads 999 on the multi-layer substrate interconnect with processing ASIC Readout Chip 60 via wire bonds 74. An X-Radiation shield 101, e.g., fabricated from tungsten, lead or other X-Radiation shielding material, is disposed between and adhesively bonded to carrier substrate 58 and ASIC Readout Chip 60. X-Radiation shield 101 allows the use of non-X-Radiation-hardened ASIC Readout Chips. Such a shield 101 can be bonded onto the substrate 58 or recessed into the substrate 58. Use of non-X-Radiation hardened ASIC Readout Chips allows a minimum Chip die size and cost in applications in applications where the number of channels per unit area inside the Readout ASIC must be maximized for practicality. One such application is shown in FIG. 12.

Figure 12:
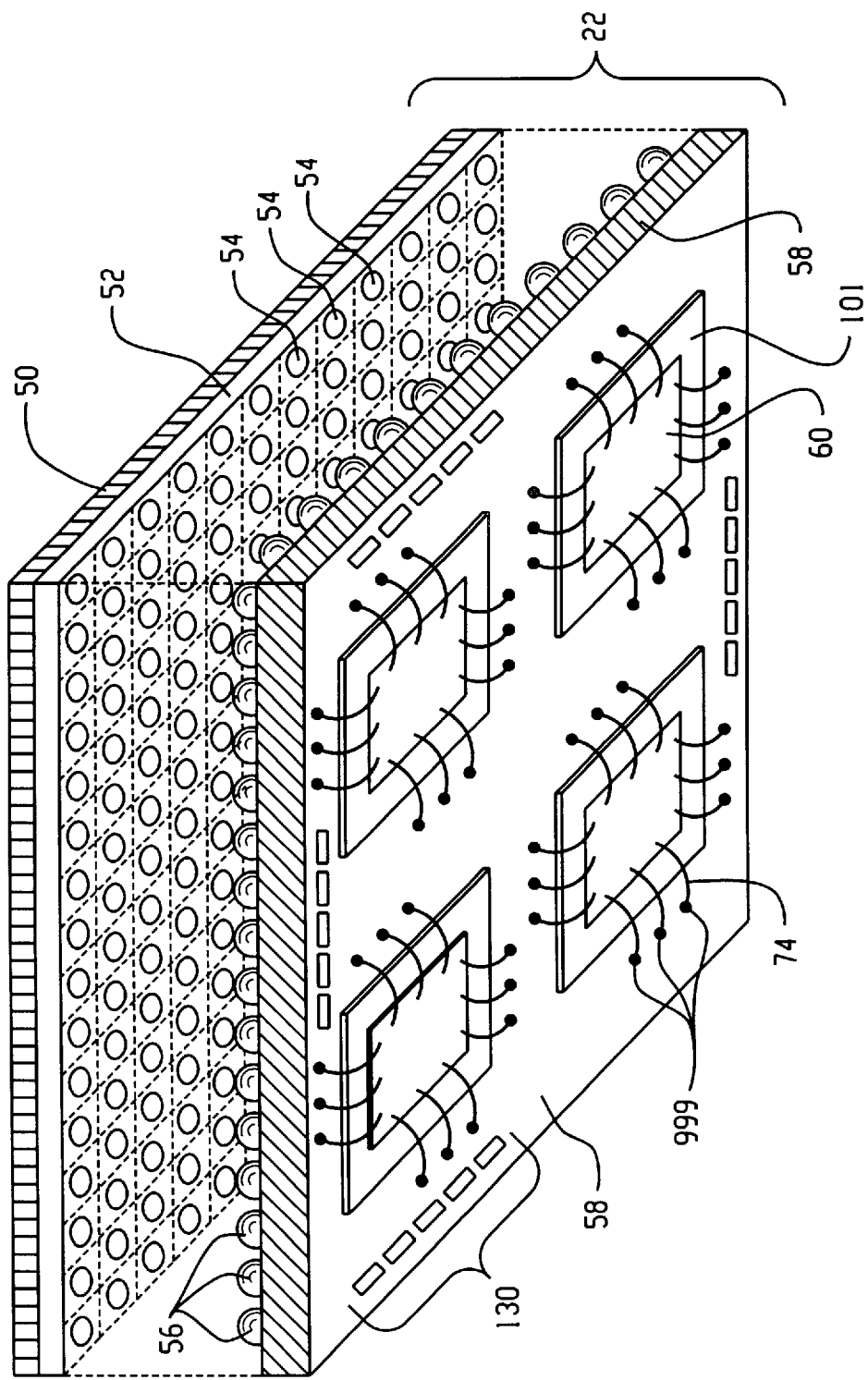
FIG. 12 illustrates an embodiment of the present invention employing wire bonding and providing X-Radiation shielding of ASIC Readout Chips on a mosaic photodetector array.

Referring now to FIG. 12, an embodiment employing an X-Radiation shield 101 on a substrate of a mosaic photodetector array is depicted. The shield 101 is positioned directly between the ASIC Readout Chip 60 and the substrate 58, thus shielding the ASIC Readout Chip from X-Radiation which would otherwise be directly incident upon it. Such a shield 101 can be bonded onto the substrate 58 or recessed into the substrate 58. The ASIC Readout Chips 60 are depicted in die form, and wire-bonds 74 connect to pads 999 on the substrate 58. This embodiment can be employed for configurations with as few as one ASIC Readout Chip 60 per module, and is not limited to the number of ASIC Readout 60 Chips per module. This concept is presently feasible for ASIC Readout Chips 60 with a minimum of 32 photodetector input channels per ASIC Readout Chip. Use of the X-Radiation shield 101 affords the minimum die size for the ASIC Readout Chip 60. X-Radiation hardened ASIC Readout Chips, which are designed and implemented using Chip layout rules for operation in exposure to X-Radiation levels anticipated in this embodiment, will have die area that may be 40 percent larger, which is not practical for this embodiment.

Figure 13:
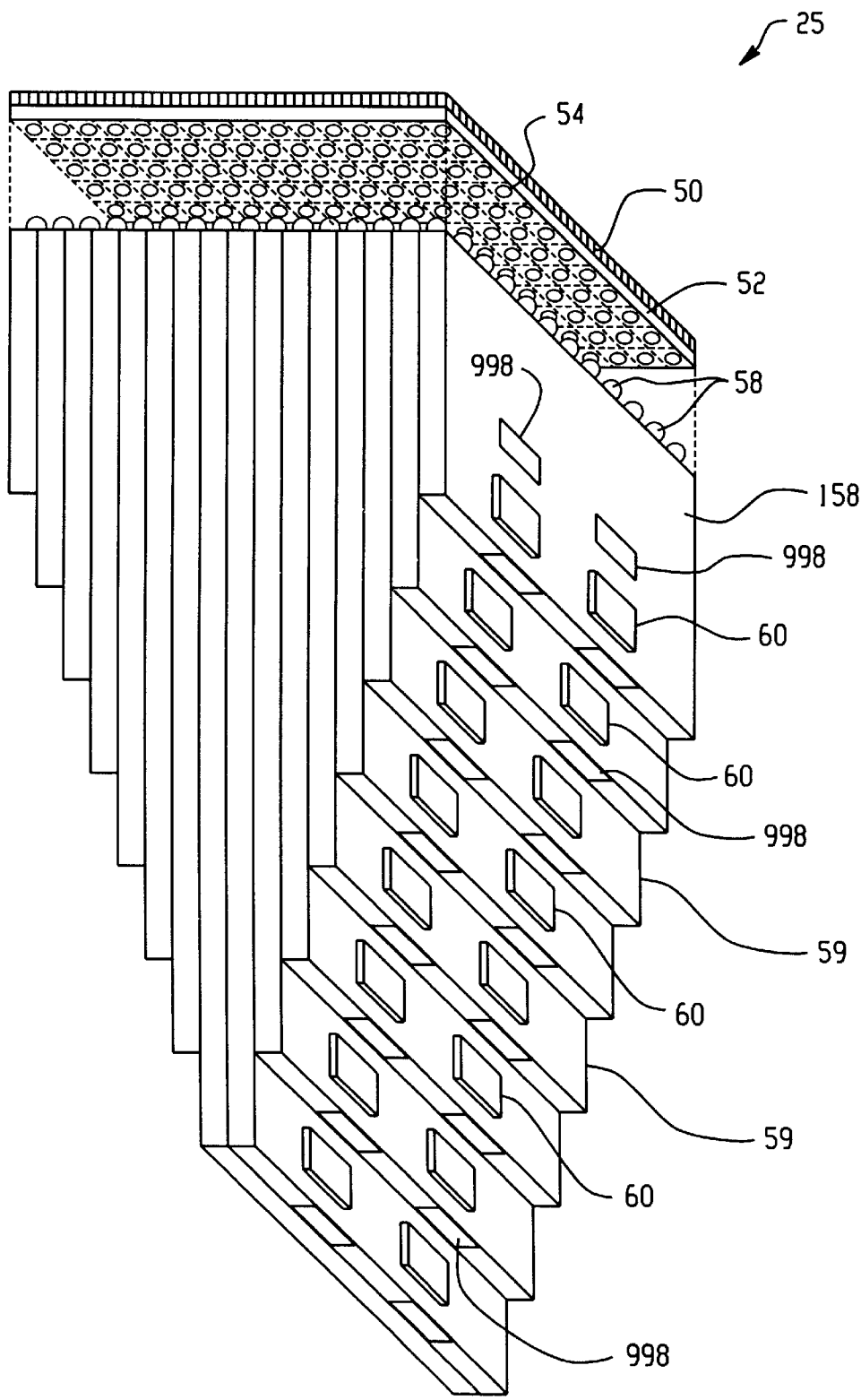
FIG. 13 illustrates an embodiment wherein multiple ASIC Readout Chips are shielded from X-Radiation in a mosaic photodetector array that affords four-sided abutment capability.

Referring now to FIG. 13, an alternative embodiment wherein an array of ASIC Readout Chips 60 are connected to a common substrate is illustrated. Multiple Readout ASIC Readout Chips 60 are shielded from X-Radiation in a mosaic photodetector array that affords four-sided abutment capability. The X-Radiation shields 998 are bonded to the substrates 158 such that the ASIC Readout Chips 60 are protected from direct X-Radiation exposure. The ASIC Readout Chips can be in die form or in Chip-scale package form as the implementation allows. The X-Radiation Shields 998 can be bonded to the substrates, or recessed into the substrates 58 on all but the outermost substrates 158, which must be bonded externally to provide shielding to the ASIC Readout Chips from X-Radiation.

Referring now to FIG. 10, an embodiment which does not use the external X-Radiation shield is illustrated. This embodiment will utilize ASIC Readout Chip design and layout rules for X-Radiation hardening. This technique is practical for this application since the ASIC Readout Chip is the same size as the photodetector.

Figure 14:
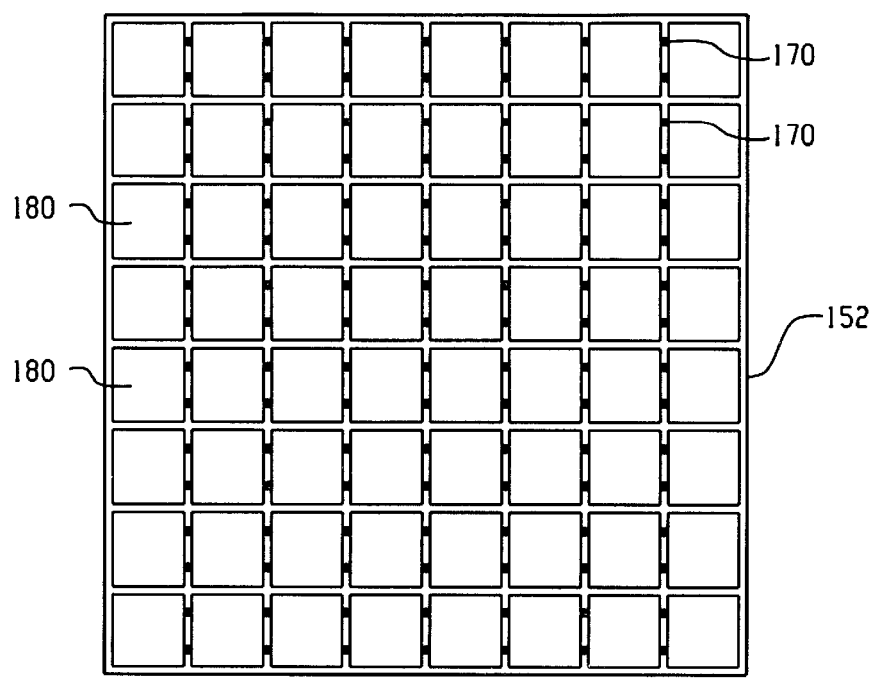
FIGS. 14 and 15 illustrate the use of a modified top surface photodiode array in place of a back-illuminated photodiode array.

Although the present invention has been discussed primarily in reference to the use of back-illuminated photodiode arrays as the photodetector device, it will be recognized that the present invention can be implemented using other types of back contact photodiode arrays. For example, each of the above-described embodiments can be modified to use a top-surface photodiode array that is modified with through-hole (via) connections to provide the routing of the photodiode output signals to the back surface of the chip. The use of a modified top surface contact photodiode arrays is advantageous in that larger silicon wafer sizes can be used. Referring now to FIG. 14, there is shown a top plan view of a top surface photodiode array 152 having formed therethrough a plurality of conductive vias 170 disposed between active photodiode areas 180.

Figure 15:
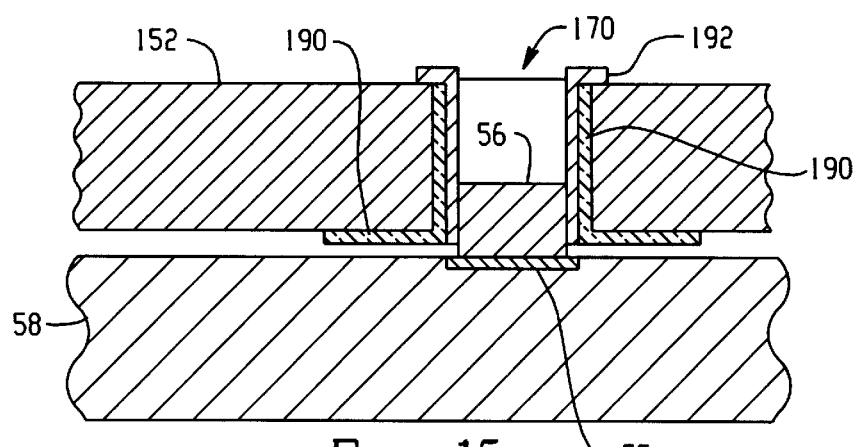

A side sectional view of a via 170 through photodiode array 152 is illustrated in FIG. 15. The via 170 is formed through the photodiode array 152 semiconductor substrate between the active areas, and an insulation layer 190 is deposited or formed on the surface of the via 170. The layer can be an insulating or passivating material described above by way of reference to FIG. 10, or other like insulating material. A conductive layer 192 is then deposited over the insulating layer 190. The conductive layer may be deposited in the channels by a selective deposition process. For example, chemical vapor deposition (CVD) processes, as are generally known to those persons skilled in the art, may be employed to deposit a conductive coating on the surface of the via channels. The metal may be deposited in the form of an inorganic salt or organometallic compound of the desired metal. It will be recognized that any conducting element deposited by a chemical vapor deposition process may be used, such as aluminum, tungsten, titanium, nickel, platinum, palladium, carbon, copper, gallium, gold, lead, silver, mercury, silver, tin, zinc, and so forth, or any mixtures or combinations thereof. In an alternative embodiment, a conductive material may be selectively plated onto the surface of the via 170.

Alternatively, the conductive material can fill the via channel. For example, a molten conductive material may be drawn into the vias using a vacuum placed on the opposite side of the chip, surface tension, or other method. Low melting point conductive materials such as gallium, indium, tin-lead solder, and so forth may advantageously be used. Top surface anode connections are made to the conductive layer 192 and the bottom surface of each conductive via 170 is bonded to a corresponding contact 55 of a carrier substrate 58 using a conductive bump 56, as detailed above. The melting temperature and chemical reactivity of the molten conductive materials must be consistent with photodiode semiconductor processing practices.

Figure 16:
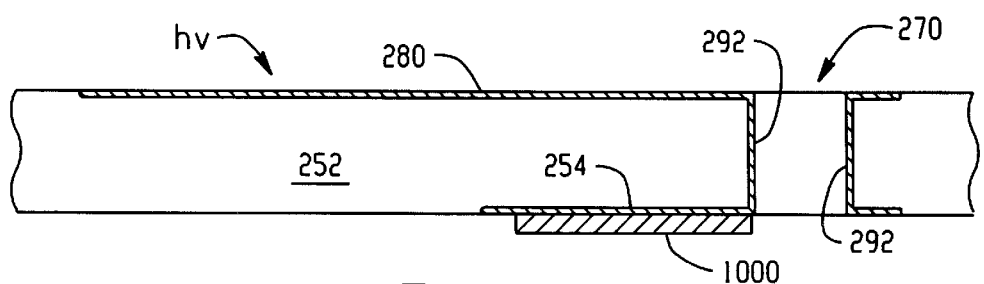
FIG. 16 shows an alternative embodiment of a modified top surface photodiode in which the top to bottom conductive vias are fabricated by impurity diffusion of the silicon.

An alternative embodiment of a top surface photodiode array modified for use with the present invention in place of a BIP array is illustrated in FIG. 16. A photodiode array 252 includes a via 270 which is made conductive by forming a conductive region 292 in the semiconductor substrate. The conductive region terminates in a contact region 254 on the back surface of the chip. A metal pad 1000 formed on the back surface of the chip is in ohmic contact with the contact region 254 of the semiconductor. The conductive region and contact region are formed by ion implantation or impurity diffusion techniques. In a preferred implementation, a photodiode 280 is formed on the surface of the n-type silicon wafer 252 by diffusing a p-type impurity using standard thermal diffusion techniques. By forming a hole in the photodiode diffusion layer 280 prior to forming the photodiode and subjecting the surface of the hole to the same thermal diffusion process as the photodiode region, the via is made conductive. Note that no insulator is required in the via because the impurity diffusion forms a reverse bias diode to the substrate silicon. Thus, an independent conductor for the photodiode signal from the topside is provided. Of course, the photodiode and the conductive via can also be formed in separate steps. The contact region 254 can be made on the bottom surface of the semiconductor substrate can also be made using diffusion or ion implantation techniques. In this preferred embodiment, the photodiode, via and contact region, whether formed separately or together, are all diffused to be P-type. A final step is to form a metal contact pad 1000 to the contact region 254. This metal pad is the interface by way of bump bonding to the associated electronics.

This conductive via technique described in the preceding paragraph can also be employed in the embodiment shown in FIG. 10.

Figure 17:
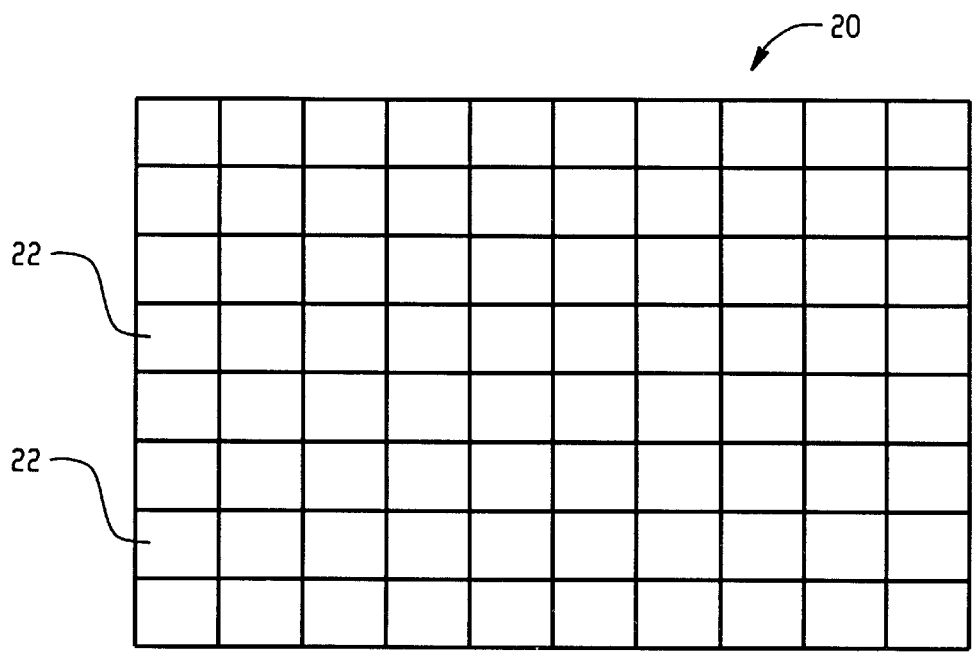
FIGS. 17 and 18 illustrate a mosaic arrangements of detector elements tiled to form larger arrays with abutment on all sides.
Figure 18:
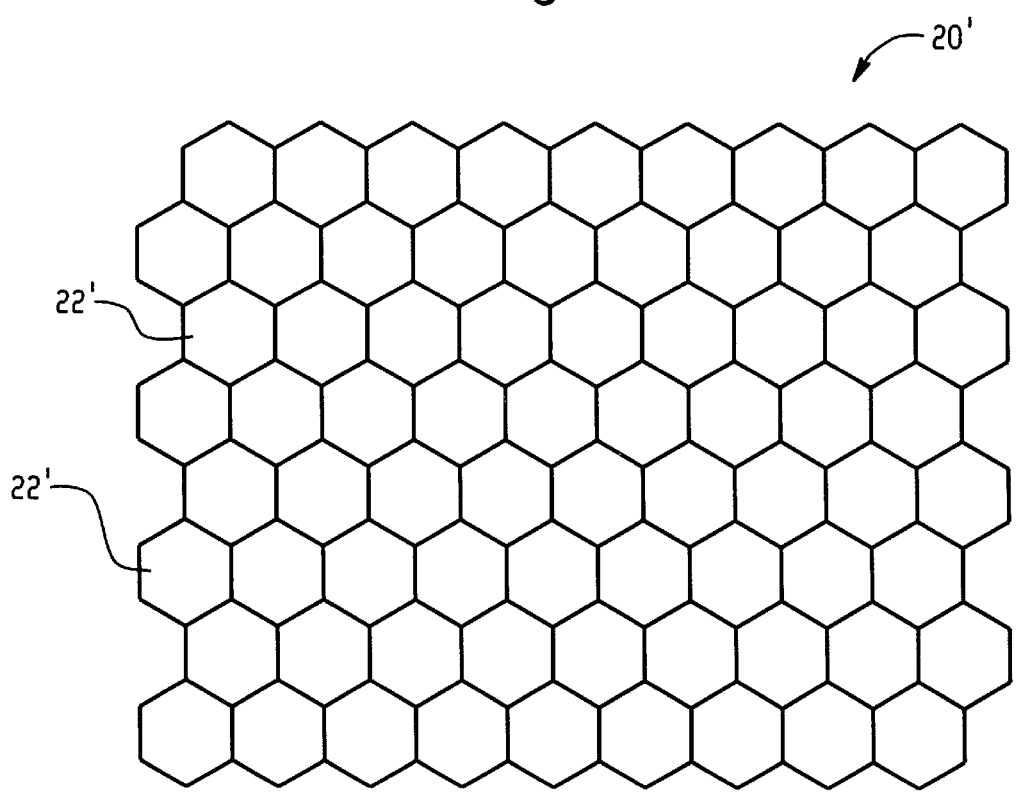

Referring now to FIG. 17 an arrangement of the individual detector modules 22 is shown with abutment on each side to form a large area image detectors 20. In FIG. 18, a similar mosaic 20' is illustrated, employing hexagonal detector modules 22'. Such large area detectors can be used to acquire projection images, or, a series of projection images in an arc around the patient to obtain a volumetric computer tomographic image. In this manner, the dimensions of the mosaic detectors in accordance with this teaching can be matched in size and shape to achieve the desired spatial response. The detectors 20 and 20' can accommodate various configurations, thus saving the cost of creating masks for the separate embodiments.

The invention has been described with reference to is the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a computerized tomography imaging scanner including an X-Radiation-sensitive detector array for converting received X-Radiation into electrical signals, and an image reconstruction processor for reconstructing images based on the received X-Radiation, the detector array comprising:
   a scintillation layer converting X-Radiation into visible light; and
   a plurality of back contact photodiode detector modules optically coupled to the scintillation layer, the detector modules tiled to form mosaic detector, each detector module comprising a bounded plane light-sensing surface defining a footprint, and each module further comprising an electrical connector for connecting the bounded plane light-sensing surface to readout electronics, each electrical connector being contained within its respective footprint.

2. In the computerized tomography imaging scanner as set forth in claim 1, the electrical connections carried within a circuit board having the same size as the bounded sensing plane.

3. In the computerized tomography imaging scanner as set forth in claim 1, the scintillation layer forming a contiguous layer over the mosaic detector.

4. In the computerized tomography imaging scanner as set forth in claim 1, each electrical connector comprising a circuit carrying substrate, and each detector module further comprising:
   signal processing circuitry electrically coupled to said circuit carrying substrate.

5. In the computerized tomography imaging scanner as set forth in claim 4, each detector module further comprising:
   an X-Radiation shield disposed between the circuit carrying substrate and the signal processing circuitry.

6. An imaging system comprising:
   an X-Radiation source selectively generating X-Radiation which at least partially traverses an examination region;
   an X-Radiation-sensitive layer which converts received X-Radiation into photons of light; and
   an array of X-Radiation detector modules positioned adjacent the examination region to receive X-Radiation from the examination region from a plurality of directions, each X-Radiation detector module including:
      an array of photodetector devices, each of which has a side in optical communication with the X-Radiation-sensitive layer and each of which generates electrical signals responsive to the photons of light generated by the X-Radiation-sensitive layer; and
      a carrier substrate supporting each photodetector device, the carrier substrate configured to provide an electrical path from contacts on a back side of the photodetector device through the carrier substrate.

7. The imaging system as set forth in claim 6, where each photodetector device includes a front side adjacent to the X-Radiation-sensitive surface for receiving incident light and a backside to which electrical connections are affixed.

8. The imaging system as set forth in claim 7, where the carrier substrate lies parallel to and is comparably sized to the photodetector device.

9. The imaging system as set forth in claim 7, wherein the X-Radiation-sensitive layer includes an array of X-Radiation-sensitive elements, each X-Radiation sensing element being optically coupled to a corresponding one of photodetector devices.

10. The imaging system as set forth in claim 6, wherein the X-Radiation detector module converts X-Radiation into electrical imaging signals, the system further comprising:
   an image reconstruction processor in data communication with signal processing circuitry, the signal processing circuitry receiving the electrical signals, the image reconstruction processor for reconstructing the electrical signals into an image representation of X-Radiation transmissive properties of a subject in the examination region.

11. The imaging system as set forth in claim 6, wherein the beam of X-Radiation forms a cone-shaped beam and the array of X-Radiation detector arrays is sized to a transverse cross-section of the cone beam.

12. The imaging system as set forth in claim 6, wherein the photodetectors comprise back-illuminated photodiodes.

13. An X-Radiation detector comprising:
   an X-Radiation-sensitive surface which converts received X-Radiation into photons of light;

a photosensitive device which has a side in optical communication with the X-Radiation-sensitive surface and which generates electrical signals responsive to the photons of light generated by the X-Radiation-sensitive surface; and a carrier substrate supporting the photosensitive device, the carrier substrate configured to provide an electrical path from contacts on a back side of the photosensitive device through the carrier substrate.

14. The X-Radiation detector as set forth in claim 13, wherein the X-Radiation-sensitive surface is disposed across an examination region from an X-Ray source and facing the X-Ray source, and further including:

a rotatable support structure which supports the X-Ray source and the carrier substrate for rotation around the examination region.

15. The X-Radiation detector as set forth in claim 13, the photosensitive device comprising:

an integrated circuit structure comprising a semiconductor substrate having an upper surface comprising a light-receiving surface forming a bounded plane, a base surface disposed opposite the upper surface, and a plurality of peripheral side surfaces joining the upper and base surfaces;

functional integrated circuitry formed in the semiconductor substrate, the integrated circuitry including an array of photodiodes optically coupled to the X-Radiation-sensitive surface; and a first set of electrical contacts disposed on the base surface and electrically coupled to the functional integrated circuitry.

16. The X-Radiation detector as set forth in claim 15, the carrier substrate comprising:

a second set of electrical contacts formed on an upper surface thereof, the first and second sets of electrical contacts configured to provide an electrical connection between the functional integrated circuitry and signal processing circuitry when the base surface of the integrated circuit structure and the upper surface of the carrier substrate are placed in aligned facing relation.

17. The X-Radiation detector as set forth in claim 16, wherein the carrier substrate is configured to allow other like X-Radiation detector elements to be tiled in adjacent and abutting relation along any and all of said peripheral side surfaces.

18. The X-Radiation detector as set forth in claim 17, wherein the carrier substrate further comprises:

a third set of electrical contact disposed on a base surface of the carrier substrate, the base surface of the carrier substrate opposite the upper surface of the carrier substrate, the third set of contacts electrically coupled to the second set of electrical contacts.

19. The X-Radiation detector as set forth in claim 18, further comprising:

signal processing circuitry electrically connected to the third set of electrical contacts and mounted on the carrier substrate.

20. The X-Radiation detector as set forth in claim 19, wherein the signal processing circuitry comprises one or more of electronic amplification circuitry, multiplexing circuitry, and analog-to-digital conversion circuitry.

21. The X-Radiation detector as set fort h in claim 20, wherein the signal processing circuitry is formed on one or more integrated circuit chips.

22. The X-Radiation detector as set forth in claim 19, wherein the signal processing circuitry is nonradiation hardened, and further comprising:

an X-Radiation shield disposed between the carrier substrate and the signal processing circuitry.

23. The X-Radiation detector as set forth in claim 22, further comprising:

electrical connections between the third set of contacts and the signal processing circuitry selected from tape automated bonding connections and wire bond connections.

24. The X-Radiation detector as set forth in claim 15, wherein the functional integrated circuitry further comprises multiplexing circuitry.

25. The X-Radiation detector as set forth in claim 15, wherein the functional integrated circuitry further comprises analog-to-digital conversion circuitry.

26. The X-Radiation detector as set forth in claim 16, further comprising conductive bumps electrically coupling the first and second sets of electrical contacts.

27. The X-Radiation detector as set forth in claim 13, wherein the carrier substrate is selected from a multilayer printed circuit board and a dispersion block.

28. The X-Radiation detector as set forth in claim 13, wherein:

said photosensitive device is selected from a back-illuminated photodiode and a modified front-illuminated photodiode;

said carrier substrate having formed therein an application-specific integrated circuit (ASIC), the ASIC including:

readout electronics;

conductive leads passing over a peripheral side surface to carry electrical signals from its top to bottom side, the side conductors configured to allow arranging the detector with a plurality of other like detectors in a two-dimensional, tiled array;

an insulating layer disposed between the peripheral side surface and the conductive leads; and optionally, one or more recesses formed in the peripheral side surface and containing the conductors.

29. The X-Radiation detector as set forth in claim 13, further comprising a plurality of additional like X-Radiation detectors arranged to form a tiled two-dimensional array such that respective X-Radiation-sensitive surfaces abut adjacent X-Radiation-sensitive surfaces.

30. The X-Radiation detector as set forth in claim 13, wherein the photosensitive device comprises a top surface photodiode array having a plurality of conductive vias formed therethrough, the conductive vias disposed between active photodiode areas of the photodiode array.

31. A method comprising:

irradiating an X-Radiation-sensitive surface with X-Radiation;

converting the X-Radiation incident upon the X-Radiation-sensitive surface into light;

transmitting the light to a light-sensitive surface of a photodiode array to produce an electrical signal proportional to the converted light; and communicating the electrical signal to signal processing circuitry via a conductive path comprising:

a first set of contacts disposed on a back surface of the photodiode array opposite the light-sensitive surface;

a second set of contacts disposed on a front surface of a circuit carrying substrate, the second set of contacts aligned with and electrically coupled to the first set of contacts when the back surface of the photodiode array and the front surface of the substrate are in aligned facing relation; and a third set of contacts disposed on a back surface of the substrate opposite the front surface of the substrate.

32. The method as set forth in claim 31, further comprising:

performing said steps of irradiating, converting, transmitting, and communicating with a plurality of X-Radiation-sensitive surfaces and photodiode arrays arranged as a mosaic; and establishing electrical communication between the processing circuitry and each photodiode array.

33. The method as set forth in claim 32, wherein the X-Radiation irradiating the X-Radiation-sensitive surface includes a cone beam of X-Rays, and wherein the method further comprises:

shaping the mosaic detector complementarily in relation to a cross section of the cone beam.

34. The method as set forth in claim 31, wherein the photodetectors comprise back contact photodiodes.

35. The method as set forth in claim 31, wherein the processing circuitry is nonradiation hardened, and further comprising:

placing an X-Radiation shield between the substrate and processing circuitry to shield the processing electronics from X-Radiation.

36. A front-illuminated photodiode array comprising:

a silicon substrate carrying an integrated circuit, the integrated circuit comprising an array photodiode elements in optical communication with a first surface of the silicon substrate;

a plurality of conductive vias electrically coupled to the photodiode elements for carrying electrical signals from the photodiode elements, each via comprising (i) a channel passing through the silicon substrate from the first surface to a second surface which is disposed opposite the first surface, and (ii) a conductive path formed by near-surface impurities in the silicon substrate, the conductive path extending from the first surface to the second surface through the via; and a plurality of a metal pads formed on the second surface, the metal pads in ohmic contact with the conductive regions, the metal pads configured to facilitate electrical connection of the photodiode array with an external connector.

* * * * *